United States Patent
Sato et al.

(10) Patent No.: US 8,933,514 B2
(45) Date of Patent: Jan. 13, 2015

(54) TRANSISTOR WITH MIM (METAL-INSULATOR-METAL) CAPACITOR

(71) Applicant: Hitachi, Ltd., Tokyo (JP)

(72) Inventors: Kiyohiko Sato, Ome (JP); Ryohei Maeno, Toyama (JP); Tsuyoshi Fujiwara, Hamura (JP); Akira Otaguro, Ome (JP); Yukino Ishii, Hamura (JP); Kiyomi Katsuyama, Iruma (JP); Hidenori Sato, Ome (JP); Daichi Matsumoto, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/750,764

(22) Filed: Jan. 25, 2013

(65) Prior Publication Data
US 2013/0221486 A1    Aug. 29, 2013

(30) Foreign Application Priority Data

Feb. 28, 2012   (JP) ................................ 2012-040890

(51) Int. Cl.
*H01L 21/331*   (2006.01)

(52) U.S. Cl.
USPC ............ 257/360; 257/528; 257/532; 257/535

(58) Field of Classification Search
USPC ............... 257/296–300, 301–303, 306–308, 257/312–313, 528, 535
See application file for complete search history.

(56) References Cited

U.S. PATENT DOCUMENTS

| | | |
|---|---|---|
| 2004/0046203 A1 | 3/2004 | Morimoto |
| 2009/0029507 A1* | 1/2009 | Goto et al. .................... 438/151 |
| 2010/0019312 A1* | 1/2010 | Sekine et al. ................ 257/326 |

FOREIGN PATENT DOCUMENTS

| | | |
|---|---|---|
| JP | 2002-151649 A | 5/2002 |
| JP | 2006-173319 A | 6/2006 |

OTHER PUBLICATIONS

Phung et al., "Modeling the Negative Quadratic VCC of $SiO_2$ in MIM Capacitor", IEEE Electron Device Letters, Dec. 2011, pp. 1671-1673, vol. 32, No. 12.
Van Huylenbroeck et al., "A 0.25µm SiGe BiCMOS Technology including Integrated RF Passive Components optimized for Low Power Applications", European Solid-State Device Research, 2003 33$^{rd}$ Conference on ESSDERC '03, 2003, pp. 506-508.

* cited by examiner

*Primary Examiner* — Dung A. Le
(74) *Attorney, Agent, or Firm* — Miles & Stockbridge P.C.

(57) ABSTRACT

The orientation polarization (positive and negative) of the Si—N bonds and the Si—O bonds is canceled, thereby enabling to minimize the polarization in a capacitive insulating film. As a result, a silicon oxynitride film with a small voltage secondary coefficient is formed, and is applied as a capacitive insulating film for use in a MIM capacitor. Specifically, the refractive index "n" of the silicon oxynitride film satisfies $1.47 \leq n \leq 1.53$, for light with a wavelength of 633 nm.

5 Claims, 13 Drawing Sheets

TRANSISTOR WITH MIM (METAL-INSULATOR-METAL) CAPACITOR

CLAIM OF PRIORITY

The present application claims priority from Japanese patent application JP 2012-040890 filed on Feb. 28, 2012, the content of which is hereby incorporated by reference into this application.

FIELD OF THE INVENTION

The present invention relates to a semiconductor device, such as a transistor, with a MIM (Metal-Insulator-Metal) capacitor.

BACKGROUND OF THE INVENTION

As a capacitor that is formed in accordance with semiconductor processes, a MIM capacitor has some advantages over other structures, such as a MIS (Metal-Insulator-Silicon) capacitor. The advantages include that the accuracy of the capacitance can be increased, and the chip area can be made small because the capacitor can be formed in the upper wiring layer. Thus, it is anticipated that the MIM capacitor is used in a wide variety of ways, such as CMOS, BiCMOS, and bipolar chips. Typical uses of the MIM capacitor include: a filter or an analog capacitor in an A/D or D/A converter, an oscillator or oscillation circuit in an RF circuit, an RF coupling and a capacitor for RF device in a matching network.

In a high accuracy A/D converter, it is required that the capacitance variation of the capacitance be very small. Note that this capacitance variation occurs depending on a voltage to be applied to the capacitor or the temperature. However, it is difficult to realize those characteristics required for the capacitor, using only a MIM capacitor device. In general, to compensate for the capacitance variation, a compensating circuit is provided. If the MIM capacitor capacitance depends only a little on the voltage or temperature, the compensating circuit is not necessary, and the chip area can be reduced.

Capacitance "C" of the MIM capacitor has a relationship with a voltage V to be applied to the capacitor. The relationship can be expressed by an equation, $C=CV(0)+CV(1)\cdot V+CV(2)\cdot V^2$, when $CV(0)$ is the capacitance density at 0 V, $CV(1)$ is the linear voltage coefficient of capacitance, and $CV(2)$ is the quadratic voltage coefficient of capacitance. The voltage secondary coefficient $CV(2)$ differs depending on the material of the insulating film included in the capacitor. In the case of a P—SiN film as a silicon nitride film in accordance with an insulating film plasma CVD technique, the voltage secondary coefficient $CV(2)$ may be in a range from +25 to +40 ppm/$V^2$. Similarly, in the case of a P—SiO film as a silicon oxide film in accordance with the plasma CVD technique, the voltage secondary coefficient $CV(2)$ may be in a range from −25 to −35 ppm/$V^2$.

Non-patent document 1 (Thanh Hoa Phung, et al., "Modeling the Negative Quadratic VCC of SiO2 in MIM capacitor", IEEE ELECTRON DEVICE LETTERS, VOL 32, NO. 12, PP 16 71-1673, DECEMBER 2011) considers that the voltage secondary coefficient is generated due to the polarization in the CVD film. In this document, it is discussed that, in the case of a SiO film, the film defects are reduced by performing annealing treatment, thereby decreasing the voltage secondary coefficient $CV(2)$ (Non-patent document 1 (Thank Hoa Phung, et al., "Modeling the Negative Quadratic VCC of SiO2 in MIM capacitor", IEEE ELECTRON DEVICE LETTERS, VOL 32, NO. 12, PP 16 71-1673, DECEMBER 2011)). In addition, it is estimated that the polarization is caused by the orientation polarization due to the film defects.

Non-patent document 2 (S. Van Huylenbroeck, et al, "A 0.25 μm SiGe BiCMOS Technology including Integrated RF Passive Components optimized for Low Power Applications", European Solid-State Device Research, 2003 33$^{rd}$ Conference on. ESSDERC '03, pp. 506-508, 2003), discloses a technique for canceling positive/negative coefficients by forming the insulating film with a bilayer structure of SiO/SiN, by focusing on a point that the SiN film and the SiO film have a positive or negative voltage secondary coefficient (FIG. 9 Non-patent document 2).

Like Non-patent document 2 (S. Van Huylenbroeck, et al, "A 0.25 μm SiGe BiCMOS Technology including Integrated RF Passive Components optimized for Low Power Applications", European Solid-State Device Research, 2003 33$^{rd}$ Conference on. ESSDERC '03, pp. 506-508, 2003), Patent document 1 (Japanese Unexamined Patent Application Publication No. 2002-151649) focuses on that the P—SiN film has positive voltage dependency and the P—SiO film has negative voltage dependency. Further, Patent document 1 (Japanese Unexamined Patent Application Publication No. 2002-151649) discloses a technique for canceling the voltage dependency by connecting a MIM capacitor with the P—SiN film as an insulating film and a MIM capacitor with the P—SiO film as an insulating film, through a circuit.

Patent document 2 (Japanese Unexamined Patent Application Publication No. 2006-173319) discloses a MIM capacitor with a SiON film as an insulating film, and discloses a technique for attaining a MIM capacitor whose capacitance has low voltage dependency.

SUMMARY OF THE INVENTION

An object of the present invention is to realize a MIM capacitor which does not require any compensating circuit for compensating for the capacitance variation due to voltage dependency of the MIM capacitor, that is, a MIM capacitor whose voltage secondary coefficient $CV(2)$ satisfies $-10$ ppm/$V^2 \leq CV(2) \leq 10$ ppm/$V^2$.

Like Non patent document 2 (S. Van Huylenbroeck, et al, "A 0.25 μm SiGe BiCMOS Technology including Integrated RF Passive Components optimized for Low Power Applications", European Solid-State Device Research, 2003 33$^{rd}$ Conference on. ESSDERC '03, pp. 506-508, 2003), in the case of the bilayer structure of a SiO film/SiN film, the process cost is very high. In this technique, though the capacitor has other characteristics, such as the leakage current, the dielectric absorption, and the temperature dependence of capacitance, those characteristics may possibly be degraded.

The technique of Patent document 1 (Japanese Unexamined Patent Application Publication No. 2002-151649) may undesirably have the possibility of an increased circuit scale, because two connected MIM capacitors are used.

According to one aspect of the present invention, there is provided a semiconductor device having a MIM (Metal-Insulator-Metal) capacitor comprising: a lower electrode; an upper electrode, and a capacitive insulating film which is arranged between the lower electrode and the upper electrode, and wherein the capacitive insulating film is a silicon oxynitride film whose composition ratios of N/Si and O/Si measured using an XPS (X-ray Photoemission Spectroscopy) technique are $0.024 \leq N/Si \leq 0.22$ and $1.74 \leq O/Si \leq 2.1$.

According to another aspect of the present invention, there is provided a semiconductor device has a MIM (Metal-Insulator-Metal) capacitor comprising: a lower electrode; an upper electrode; and a capacitive insulating film which is arranged between the lower electrode and the upper electrode, and wherein the capacitive insulating film is a silicon oxynitride film whose refractive index satisfies $1.47 \leq n \leq 1.53$, for light with a wavelength of 633 nm.

A MIM capacitor with low voltage dependency can be realized.

DETAILED DESCRIPTION OF THE PREFERRED EMBODIMENTS

Figure 24:
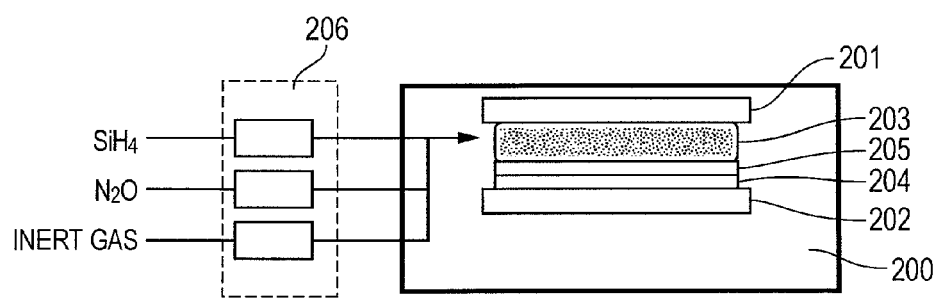
FIG. 24 is a diagram for explaining a manufacturing method of the capacitive insulating film using a plasma CVD technique.
Figure 25:
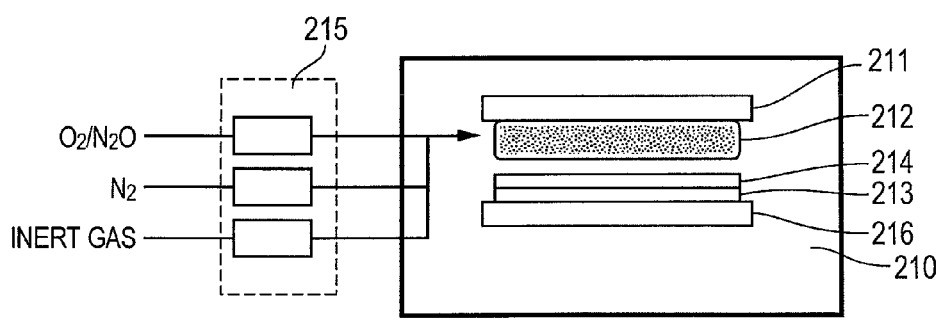
FIG. 25 is a diagram for explaining a manufacturing method of the capacitive insulating film using a sputtering technique.

Descriptions will now be made of a capacitive insulating film (SiON film) of the present invention, using FIG. 24 and FIG. 25.

Description will first be made of a film formation method when an oxynitride film as a capacitive insulating film of the MIM capacitor is formed using a plasma CVD technique, with reference to FIG. 24. As gas, $SiH_4/N_2O$ and inert gas (He, $N_2$, etc.) are used. This inert gas is particularly used as diluent gas or carrier gas. These gas species are introduced into a chamber 200 having a certain pressure range. In this case, the pressure range is preferably between 1 and 10 Torr. In this state, plasma 203 is generated between an upper electrode 201 and a lower electrode 202 of a plasma CVD device, to form a CVD film 205 on a semiconductor device substrate 204.

According to the present invention, to attain the desired film quality, as will be described later (as defined based on the composition, refractive index, etc.), of a silicon oxynitride film, a mass flow controller 206 is installed in each gas system, and controls a flow amount of $SiH_4$, $N_2O$, and inert gas. It is preferred that the inflow entrance of gas is configured through the upper electrode 201 of the plasma CVD device.

The lower electrode 202 of the plasma CVD device preferably has a heater structure to control the temperature. This is because the temperature during the film formation of the capacitive insulating film is kept between 300° C. and 500° C., in order to avoid a decrease in the yield. If the film formation is performed at a higher temperature than the above temperature range, in the general aluminum wiring of the semiconductor device, the surface of the lower electrode of the capacitor becomes rough due to movement of Al atoms, resulting in high defect density of the capacitive insulating film. If the film formation is performed at a lower temperature than the above temperature range, an insulating film (SiH or the like) with weak bonds is formed therein, resulting in high defect density of the capacitive insulating film. The film formation temperature can be applied also to the following sputtering technique.

Those gas species, such as $SiH_4$ and $N_2O$, are described only by way of example. Any other gas species, such as $Si_2H_6$ and $O_2$ may also be used.

Description will now be made of a film formation method, when a silicon oxynitride film (as the capacitive insulating film of the MIM capacitor) is formed using a sputtering technique. Referring to FIG. 25, in the case of the sputtering technique, a Si target 211 is arranged in a chamber 210, $N_2O$ or $O_2$ and $N_2$ gas are introduced, inert gas (Ar) is applied for generating plasma 212, and these gas species are introduced into the chamber 210 with a predetermined pressure range. In the sputtering technique, the chamber 210 is in a high vacuum state, and its pressure range is between 1 and 10 m Torr. In this state, plasma is generated, to form a sputtered film 214 on a semiconductor device substrate 213.

According to the present invention, to attain the desired film quality (as defined based on the composition, refractive index, etc.) of a silicon oxynitride film, a mass flow controller 215 is installed in each gas system, and controls a flow amount of $O_2$ (or $N_2O$), $N_2$, and inert gas. The semiconductor device substrate 213 is arranged on a substrate holder 216.

The substrate holder 216 preferably has a heater structure to control the temperature, for the same reason as that of the plasma CVD device.

The gas species, such as $N_2O$ or $O_2$, and $N_2$ are described only by way of example. Any other gas species, such as He and the like may also be used.

FIG. 1 to FIG. 6 show measured characteristics of a silicon oxynitride film as a capacitive insulating film formed on the wafer using a plasma CVD technique. The film formation temperature is 480° C., the gas species described in FIG. 24 are used, and seven patterns of the $N_2O$ partial pressure are formed without changing any other conditions, thereby performing the film formation. The conditions "a" to "g" of the $N_2O$ partial pressures include a condition a: 0.76, a condition b: 0.85, a condition c: 0.87, a condition d: 0.89, a condition e: 0.90, a condition f: 0.91, and a condition g: 0.98.

Figure 2:
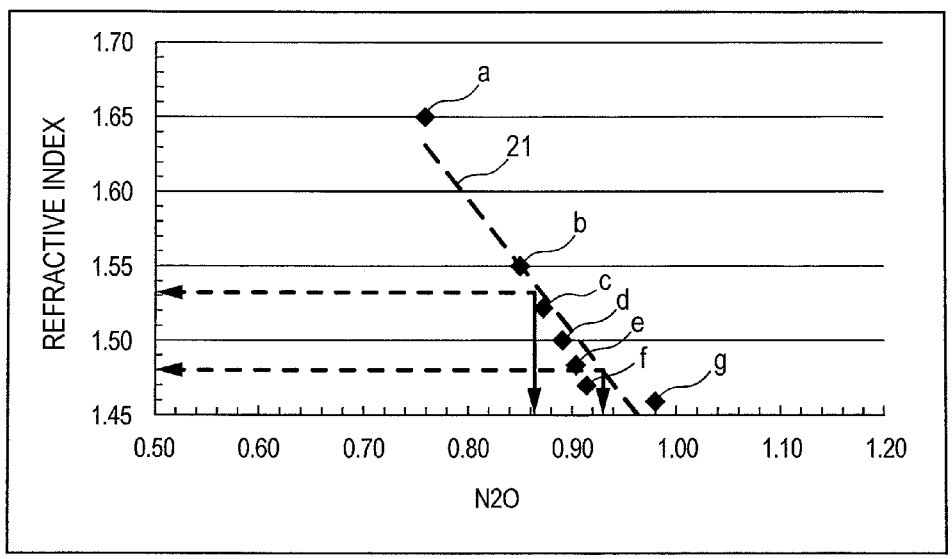
FIG. 2 is a diagram showing correlation between a refractive index and the $N_2O$ partial pressure of the capacitive insulating film according to the present invention.

FIG. 2 is a diagram showing the correlation between the $N_2O$ partial pressure and the refractive index of the silicon oxynitride film as a parameter representing the film quality of the silicon oxynitride film which has been formed under the corresponding partial pressure. The refractive index is measured based on ellipsometry using HeNe laser (wavelength: 633 nm). The points of measurement represent average values that are obtained by actually measuring the five points on the silicon wafer. In the illustration, a broken line 21 is obtained by linear approximation using the least-square method for the points of measurement, and it is obvious that the $N_2O$ partial pressure and the refractive index are in a linear relationship with each other.

Figure 1:
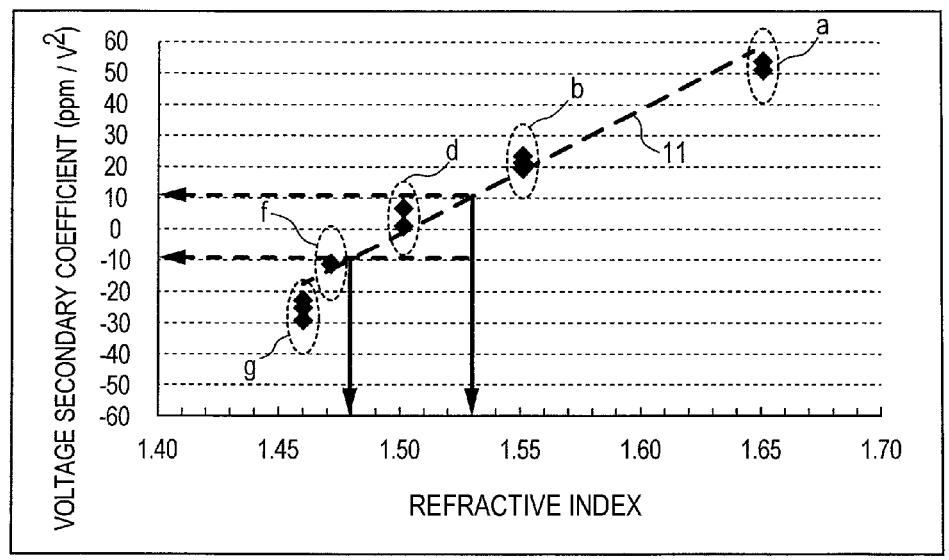
FIG. 1 is a diagram showing correlation between a voltage secondary coefficient and a refractive index of a MIM capacitor with a capacitive insulating film applied thereto, according to the present invention.

FIG. 1 shows a MIM capacitor which has the silicon oxynitride film shown in FIG. 2 as a capacitive insulating film, and shows a measured voltage secondary coefficient. In FIG. 1, the refractive index of the silicon oxynitride film formed on the silicon wafer under the conditions of FIG. 2 is provided on the horizontal axis, while the voltage secondary coefficient is provided on the vertical axis. The voltage secondary coefficient is measured when the MIM capacitor is formed on the semiconductor substrate wafer under the corresponding condition. Similarly, the average values obtained by measuring the five points on the wafer are shown as points of measurement. The reason why a plurality of points of measurements are provided on the same condition is that measurement is performed for a plurality of semiconductor substrate wafers. A broken line 11 of the illustration is formed with points of measurement obtained by linear approximation using the least square method. It is obvious that the refractive index of the capacitive insulating film and the voltage secondary coefficient are in a linear relationship with each other.

To use a MIM capacitor without a compensating circuit, the voltage secondary coefficient CV (2) needs to be kept within the range of $-10$ ppm/$V^2 \leq CV(2) \leq 10$ ppm/$V^2$. Therefore, a silicon oxynitride film with a refractive index "n" of $1.47 \leq n \leq 1.53$ may be used as a capacitive insulating film.

Figure 3:
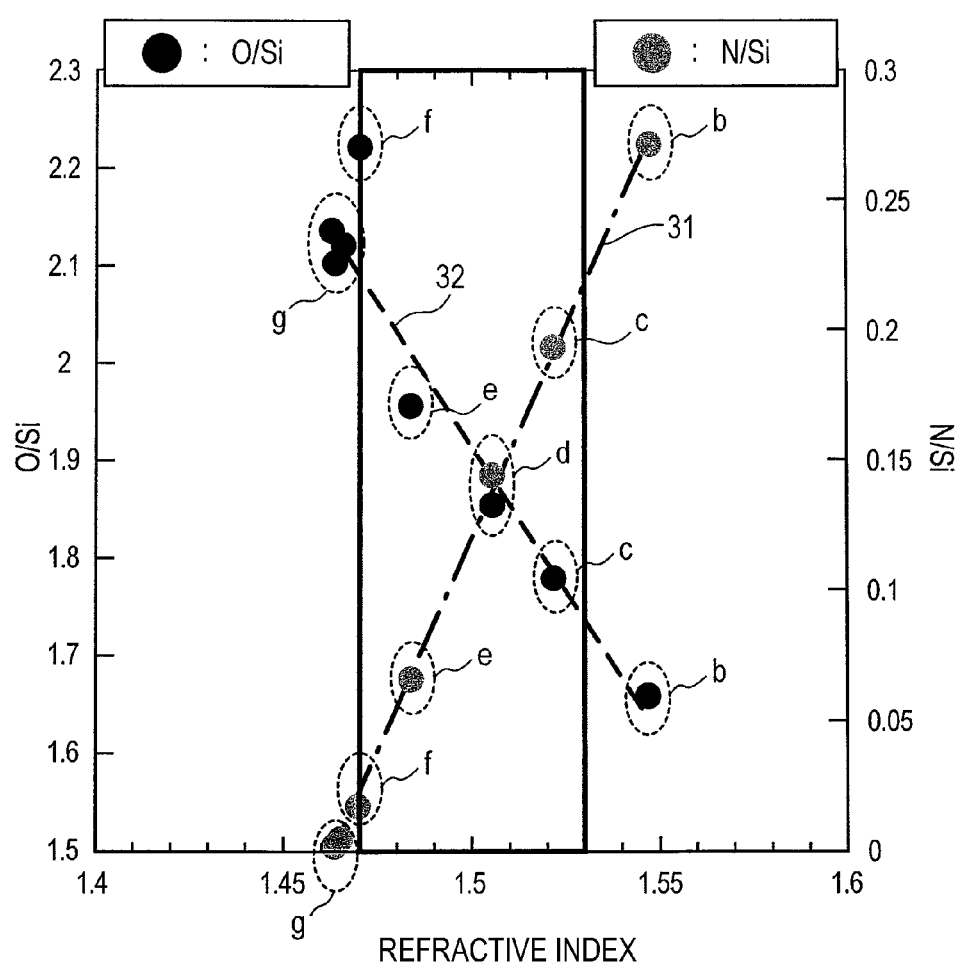
FIG. 3 is a diagram showing correlation between an O/Si ratio and the refractive index of the capacitive insulating film and correlation between an N/Si ratio and the refractive index of the capacitive insulating film according to the present invention.

FIG. 3 shows the composition of the silicon oxynitride film with the refractive index "n" of $1.47 \leq n \leq 1.53$. FIG. 3 shows an N/Si ratio and an O/Si ratio of the silicon oxynitride film formed under the conditions "b" to "g". The ratios are measured using an XPS (X-ray Photoemission Spectroscopy) method. In addition, FIG. 3 shows values measured at the center of the silicon wafer as points of measurement. Because a difference between the refractive index at the center of the wafer and the average value of the five points on the surface shown in FIG. 1 and FIG. 2 is 1% or less at maximum, the refractive index can be assumed as the representative value.

A dashed line 31 in the illustration is formed with the obtained points of measurement of the N/Si ratios by linear approximation using the least-square method. It is obvious that the N/Si ratio and the refractive index are in a linear relationship with each other. Similarly, a dotted line 32 in the illustration is formed by obtaining the points of measurements of the O/Si ratios by linear approximation using the least-square method. It is obvious that the O/Si ratio and the refractive index are in a linear relationship with each other. It can be said that a silicon oxynitride film (SiON film) whose refractive index "n" is $1.47 \leq n \leq 1.53$ has composition ratios of N/Si and O/Si that satisfy the conditions $0.024 \leq N/Si \leq 0.22$ and $1.74 \leq O/Si \leq 2.1$. Accordingly, the SiON film of the present invention has a characteristic composition that the content of N (nitrogen) is lower than O (oxygen). Patent document 2 (Japanese Unexamined Patent Application Publication No. 2006-173319) discloses a MIM capacitor with a SiON film as an insulating film, on the assumption of using also an antireflection film. The antireflection film is generally required to have the refractive index close to that of SiN, and usually has a composition with a high content of N (nitrogen). Thus, the composition is different from that of the capacitive insulating film of the present invention.

There exists some area in which the voltage secondary coefficient CV (2) becomes small, in a single layer film of the silicon oxynitride film. This can be considered because the orientation polarization (positive and negative) of the Si—N bonds and the Si—O bonds in the silicon oxynitride film is canceled, thereby enabling to minimize the polarization in the capacitive insulating film. As a result, the film defects are reduced, and it can be expected to attain other preferable characteristics required in the MIM capacitor. The silicon oxynitride film of the present invention exhibits other preferable characteristics required in the MIM capacitor. The preferable characteristics will now be described below.

Figure 4:
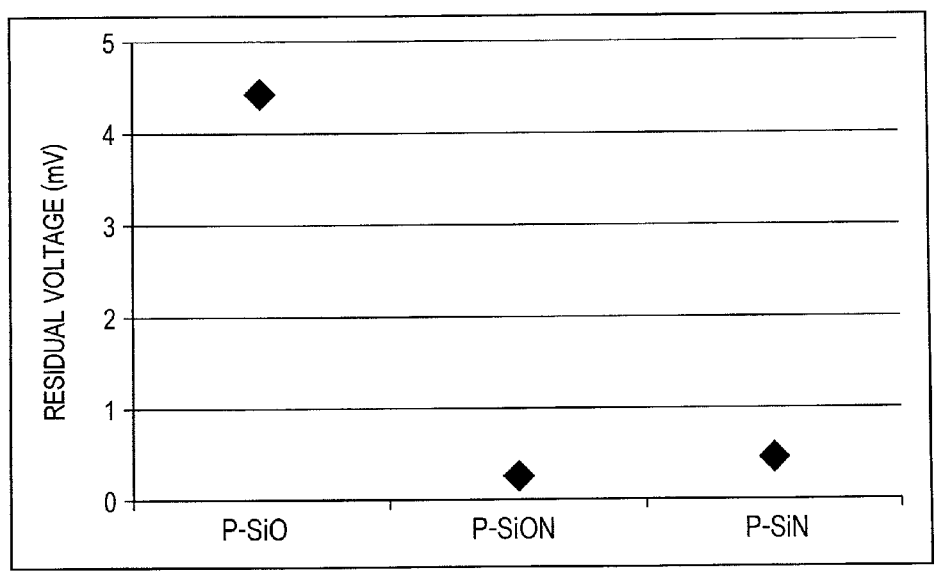
FIG. 4 is a diagram showing the film species dependency in dielectric absorption.

FIG. 4 shows the film species dependency of dielectric absorption. The dielectric absorption is a phenomenon in which a voltage (residual voltage) is generated between the upper electrode and the lower electrode of the capacitor, if the upper electrode and the lower electrode of the capacitor once are short-circuited and discharged, and then, if they are open-circuited and left. The lower the residual voltage, the better the characteristics of the capacitor. FIG. 4 shows measurement values of the potential difference (residual voltage) between the electrodes of the capacitor, ten seconds after a 60-μsecond short circuit, after application of 10V voltage between the electrodes of the MIM capacitor for one second. As a comparative example of the P—SiON film of the present invention, a P—SiO film and a P—SiN film are formed using the plasma CVD technique under the same conditions, and the illustration shows measurement results of the residual voltages. While the residual voltage of the P—SiO film is 4.3 mV and the residual voltage of the P—SiN film is 0.4 mV, the residual voltage of the P—SiON film of the present invention is 0.25 mV. That is, the P—SiON film of the present invention shows the better characteristic.

Figure 5:
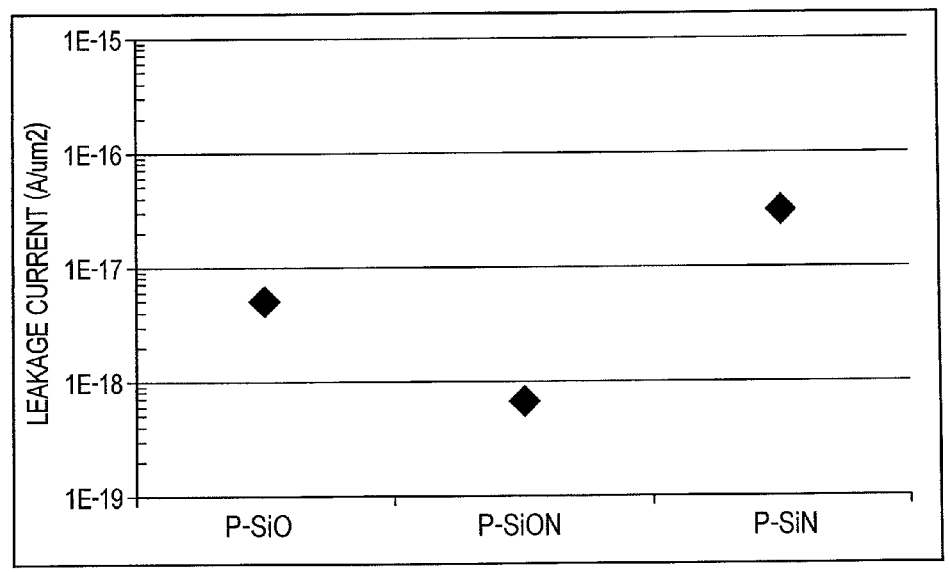
FIG. 5 is a diagram showing the film species dependency in a leakage current.

FIG. 5 shows the film species dependency of a leakage current. It shows the leakage current density between the upper and lower electrodes of the MIM capacitor with an electric field 2 MV/cm defined as (the voltage to be applied to the capacitor)/(a thickness of capacitive insulating film). As a comparative example of the P—SiON film of the present invention, a P—SiO film and a P—SiN film are formed using the plasma CVD technique under the same conditions, and the illustration shows measurement results of a leakage current. While a leakage current of the P—SiO film is $4.7 \times 10^{-18}$ A/$\mu m^2$ and a leakage current of the P—SiN film is $3 \times 10^{-17}$ A/$\mu m^2$, the P—SiON film of the present invention is $6 \times 10^{-19}$ A/$\mu m^2$. That is, the P—SiON film of the present invention shows the better characteristic.

Figure 6:
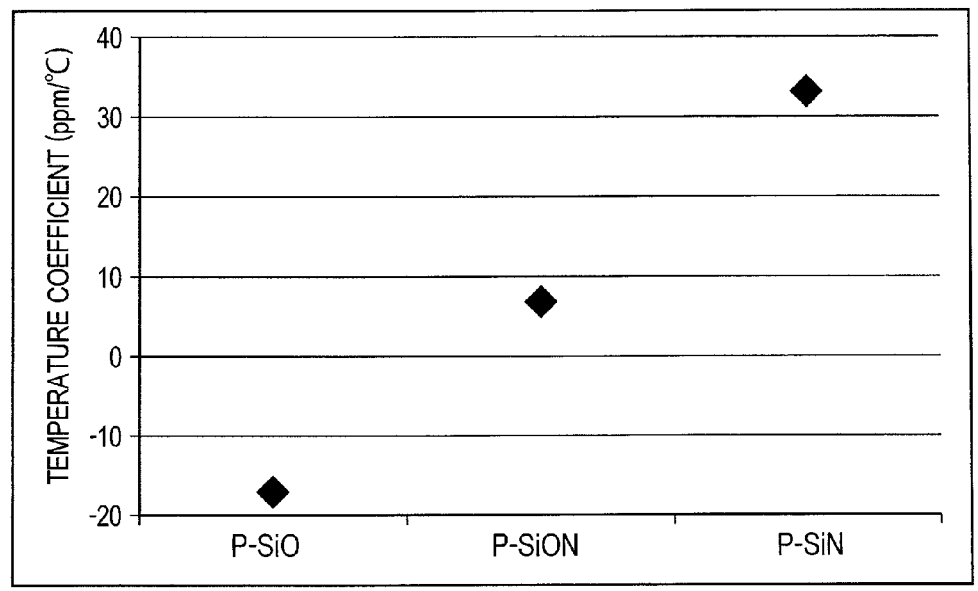
FIG. 6 is a diagram showing the film species dependency in temperature coefficient of capacitance.

FIG. 6 shows the film species dependency of a temperature coefficient. The capacitance "C" of the MIM capacitor has temperature dependency, for a temperature T. The dependency is represented by C=CT (0)+CT(1)×T. In this case, "CT(0)" is a constant number, while "CT(1)" is a temperature coefficient. As a comparative example of the P—SiON film of the present invention, a P—SiO film and a P—SiN film are formed using the plasma CVD technique under the same conditions, and the illustration shows measurement results of the temperature coefficient. While the temperature coefficient of the P—SiO film is −17.1 ppm/° C. and the temperature coefficient of the P—SiN film is 33 ppm/° C., the temperature coefficient of the P—SiON film of the present invention is 6.4 ppm/° C. That is, the P—SiON film shows the better characteristic.

Accordingly, it is understood that the MIM capacitor using the SiON film of the present invention has very good characteristics not only for the voltage dependency, but also for the dielectric absorption, the leakage current, and the temperature coefficient.

First Embodiment

FIG. 7 to FIG. 15 show an example of the process flow of the MIM capacitor as the first embodiment of the present invention. The MIM capacitor is formed in a trench formed in an interlayer insulating film, thereby decreasing the effect of the processing accuracy on the capacitance of the MIM capacitor and also reducing the process variation. Thus, in the use requiring high accuracy, the capacitive insulating film of the present invention is applied in a MIM capacitor of the example of FIG. 15, thereby realizing a MIM capacitor with high yield and high accuracy.

Figure 7:
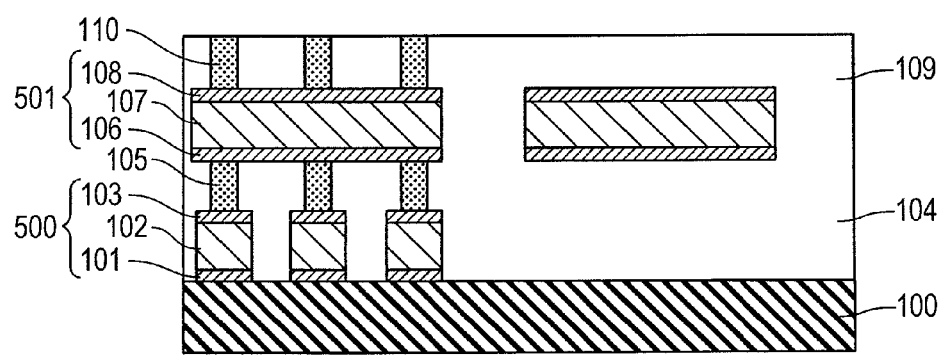
FIG. 7 is a diagram for explaining the process flow of the MIM capacitor of an embodiment 1.

FIG. 7 shows a state in which two metal wiring layers are formed on a semiconductor device substrate 100. The semiconductor device substrate 100 has a non-illustrated semiconductor device, such as a transistor, formed therein. A first metal wiring layer 500 is formed to connect between semiconductor devices. To form the first metal wiring layer 500, a laminated film is made using a sputtering technique, and includes a lower barrier film 101, a 400 nm aluminum alloy film 102, and an upper barrier film 103 on the upper layer of the film 102. The lower barrier film 101 includes a 10 nm titanium film and a 30 nm titanium nitride which are formed sequentially from the lower side. The upper barrier film 103 includes a 10 nm titanium film and a 20 nm titanium nitride which are formed sequentially from the lower side. This laminated film is processed to form the first metal wiring layer 500, using a lithography technique and a dry-etching technique. After a 1300 nm silicon oxide film is formed using the plasma CVD technique, the surface is made flat using a CMP (Chemical Mechanical Polishing) technique, to form a first interlayer insulating film 104. A contact hole is formed in a manner that the first metal wiring layer 500 is exposed using a lithography technique and a dry etching technique, and a conductive plug 105 formed of a barrier film and tungsten is formed in the contact hole. Similarly, a second metal wiring layer 501, a second interlayer insulating film 109, and a conductive plug 110 are formed.

Figure 8:
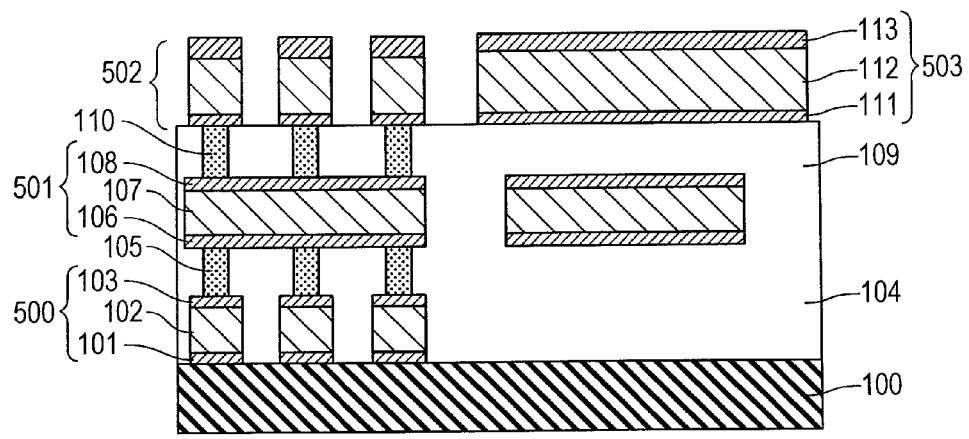
FIG. 8 is a diagram for explaining the process flow of the MIM capacitor of the embodiment 1.

FIG. 8 shows a state in which a lower electrode 503 of a MIM capacitor is formed. A laminated film is formed using a sputtering technique, and includes a lower barrier film 111, an aluminum alloy film 112 with a thickness of 400 nm, and an upper barrier film 113. The lower barrier film 111 is formed of a 10 nm titanium film and a 30 nm titanium nitride film which are formed sequentially from the lower side. The upper barrier film 113 is formed of a 10 nm titanium film and a 20 nm titanium nitride film which are formed sequentially from the lower side, on the upper layer of the film 112. This laminated film forms the lower electrode 503 of the MIM capacitor using the lithography technique and the dry etching technique. In this example, a third metal wiring layer 502 is formed at the same time as the lower electrode 503 of the MIM capacitor.

Figure 9:
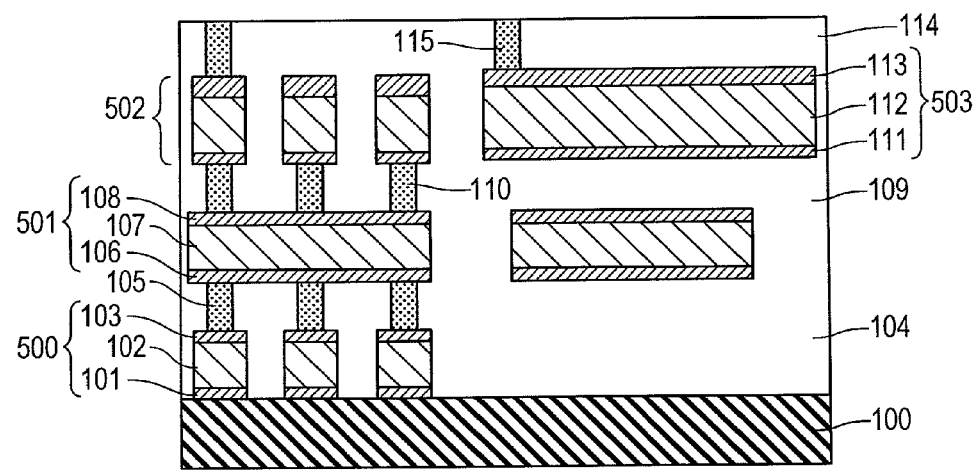
FIG. 9 is a diagram for explaining the process flow of the MIM capacitor of the embodiment 1.
Figure 10:
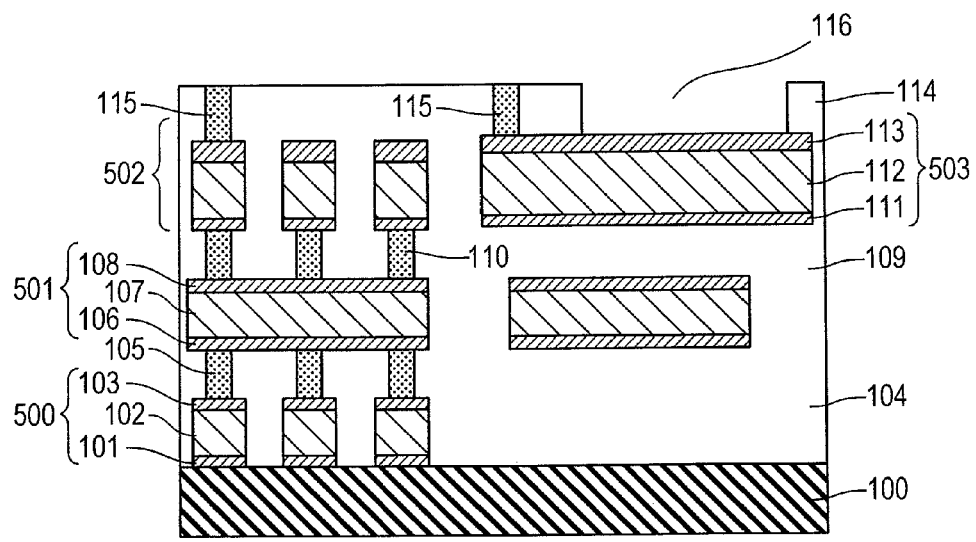
FIG. 10 is a diagram for explaining the process flow of the MIM capacitor of the embodiment 1.
Figure 11:
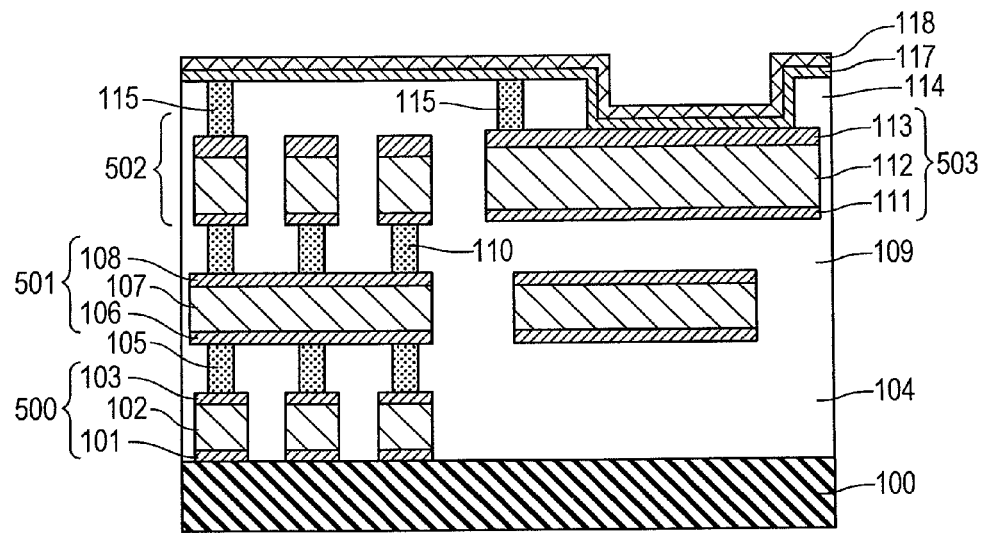
FIG. 11 is a diagram for explaining the process flow of the MIM capacitor of the embodiment 1.

FIG. 9 shows a state in which a conductive plug is formed on the lower electrode 503 of the MIM capacitor and the third metal wiring layer 502. Similarly, after a 1300 nm silicon oxide film is formed using a plasma CVD technique, the surface is made flat using the CMP technique, and a third interlayer insulating film 114 is formed. A contact hole is formed in a manner that the third metal wiring layer 502 and the lower electrode 503 of the MIM capacitor are exposed, using a lithography technique and a dry etching technique. The conductive plug 115 which is formed of a barrier film and tungsten is formed in the contact hole. A MIM capacitor forming region 116 is opened in a manner that the lower electrode 503 of the MIM capacitor is exposed, using the lithography technique and the dry etching technique (FIG. 10).

Figure 12:
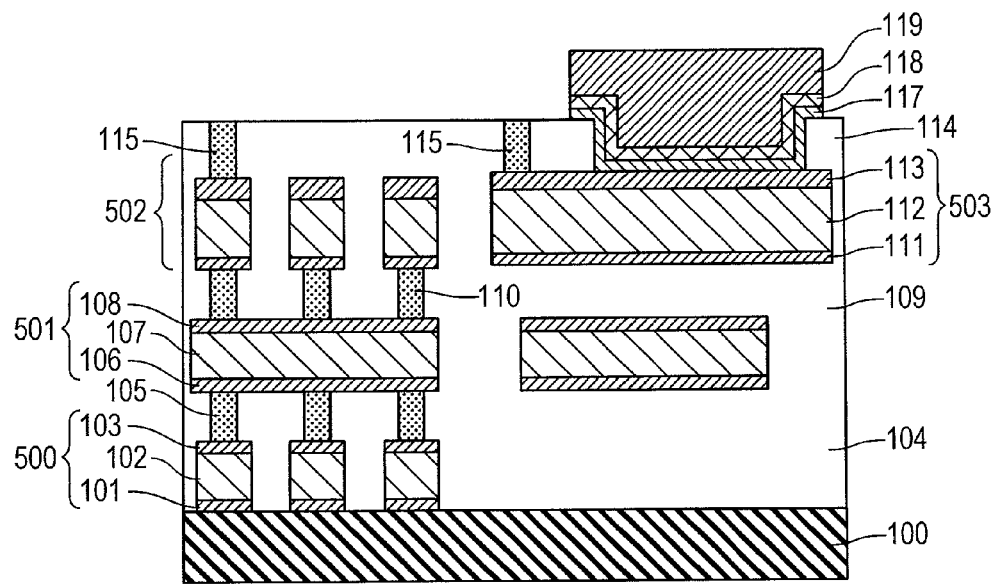
FIG. 12 is a diagram for explaining the process flow of the MIM capacitor of the embodiment 1.
Figure 13:
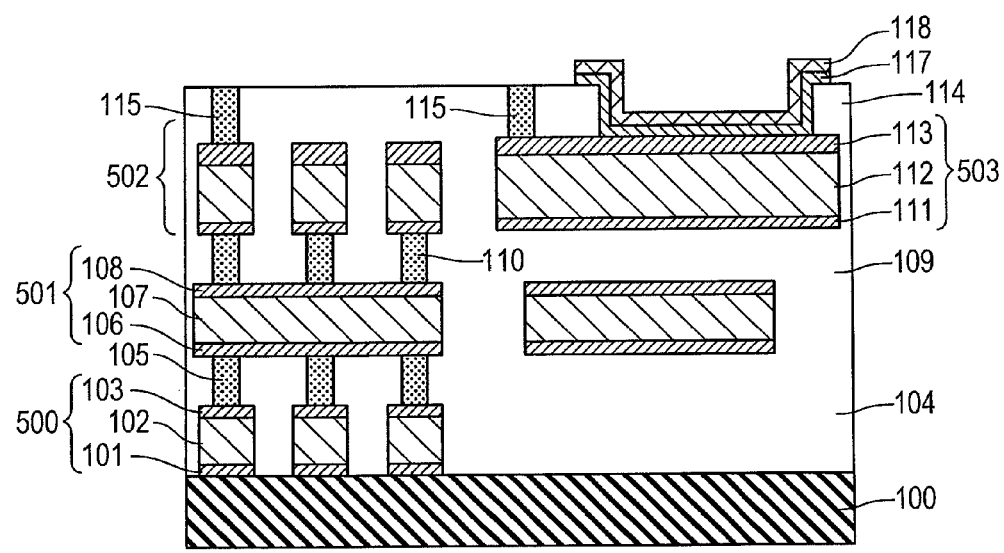
FIG. 13 is a diagram for explaining the process flow of the MIM capacitor of the embodiment 1.

After a capacitive insulating film 117 is formed, a protective film 118 (titanium nitride with a thickness of 80 nm) for the capacitive insulating film is formed using the sputtering technique. The protective film 118 has a role in protecting the capacitive insulating film 117, in a process afterwards, for example, a resist removing process. The protective film 118 for the capacitive insulating film is apart of the upper electrode of the MIM capacitor. The thickness of the capacitive insulating film 117 is set in accordance with the capacitance of the MIM capacitor. The manufacturing method of the capacitive insulating film 117 has been described with reference to FIG. 24 and FIG. 25. A resist mask 119 is formed in the MIM capacitor part, using the lithography technique, and the capacitive insulating film 117 and the protective film 118 for the capacitive insulating film are etched using a dry etching technique (FIG. 12). After this, the resist mask 119 is removed therefrom, and the upper surface of the conductive plug 115 is exposed (FIG. 13).

Figure 14:
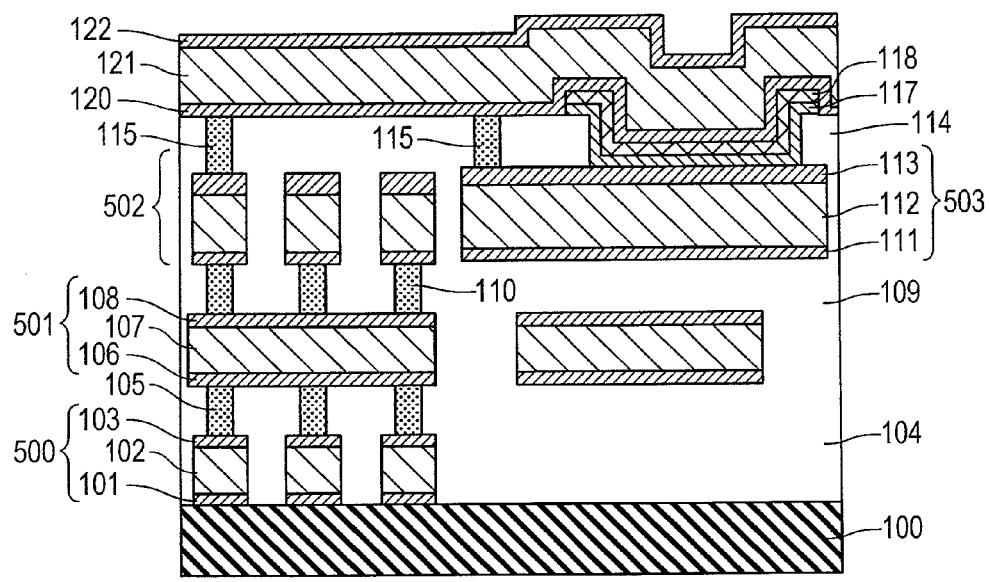
FIG. 14 is a diagram for explaining the process flow of the MIM capacitor of the embodiment 1.
Figure 15:
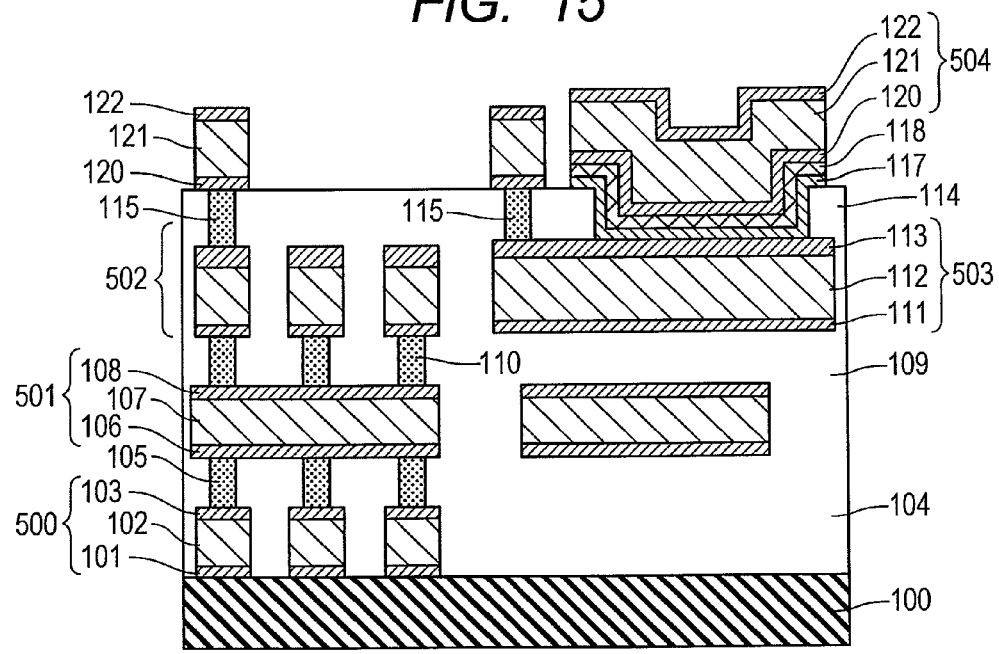
FIG. 15 is a diagram showing the MIM capacitor of the embodiment 1.

The upper electrode of the MIM capacitor will now be formed. The electrode includes a laminated film formed of a lower barrier film 120, an aluminum alloy film 121 with a thickness of 400 nm, and an upper barrier film 122, which are formed sequentially from the lower side. The lower barrier film 120 includes a titanium film with a thickness of 10 nm and a titanium nitride film with a thickness of 30 nm, which are formed sequentially from the lower side. The upper barrier film 122 is sequentially formed of a titanium film with a thickness of 10 nm and a titanium nitride film with a thickness of 20 nm, on the upper layer of the film 121 (FIG. 14). This laminated film forms an upper electrode 504 of the MIM capacitor, using the lithography technique and the dry etching technique (FIG. 15). A fourth metal wiring layer is formed at the same time as the upper electrode 504 of the MIM capacitor.

The wiring layer of this embodiment includes a titanium film with a thickness of 10 nm and a titanium nitride film with a thickness of 30 nm, which are formed sequentially from the lower side, as a lower barrier layer. Its thickness is usually determined from the aspect of the required wiring resistance and the reliability of the electromigration of the wiring. If the titanium film and the titanium nitride film are used, the total film thickness is preferably in a range between 20 nm and 100 nm. As a material of the lower barrier film, it is possible to use tantalum, molybdenum, tungsten, or any other metal mainly including a nitride film.

The aluminum alloy film in the wiring layer has a thickness of 400 nm. The lower electrode of the MIM capacitor of this embodiment can be used as a general wiring layer connecting between the semiconductor devices. The lower electrode is determined based on the wiring resistance required as its wiring layer and a series resistance component required for the MIM capacitor, from the aspect of the high frequency characteristics. The lower electrode has a thickness preferably in a range from 200 nm to 3000 nm.

An upper barrier layer of the wiring layer includes a titanium film with a thickness of 10 nm and a titanium nitride film with a thickness of 20 nm, which are formed sequentially from the lower side. As a material of the upper barrier film, it is possible to use any other metal including tantalum, molybdenum, tungsten, in combination with a nitride film, thus attaining an effect as a measure of a crack of the upper barrier film.

Further, the first metal wiring layer 500 and the second metal wiring layer 501 are formed using a wiring layer mainly including an aluminum alloy film which has been processed using the dry etching technique. The first conductive contact hole plug 105 for connecting therebetween is formed using a metal film mainly including tungsten. Alternatively, an aluminum wiring layer or a copper-wiring layer may be used in accordance with a damascene technique. These wiring layers have the same configuration as that of a second embodiment.

Second Embodiment

Each of FIG. 16 to FIG. 22 shows an example of the process flow of a MIM capacitor according to the second embodiment of the present invention. In this embodiment, a single photomask is used for forming the MIM capacitor, thus forming the MIM capacitor at low cost.

Figure 16:
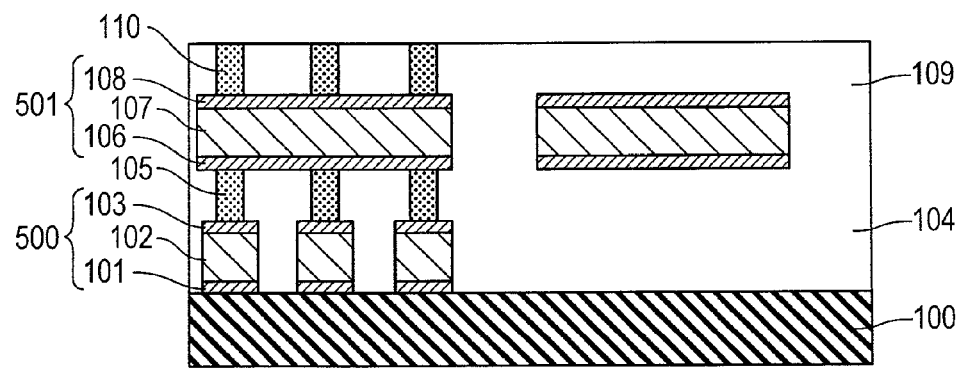
FIG. 16 is a diagram for explaining the process flow of a MIM capacitor of an embodiment 2.

FIG. 16 shows a state in which two metal wiring layers are formed on the semiconductor device substrate 100. The same constituent elements as those of the first embodiment are identified with the same reference numerals, and will now repeatedly be described again.

Figure 17:
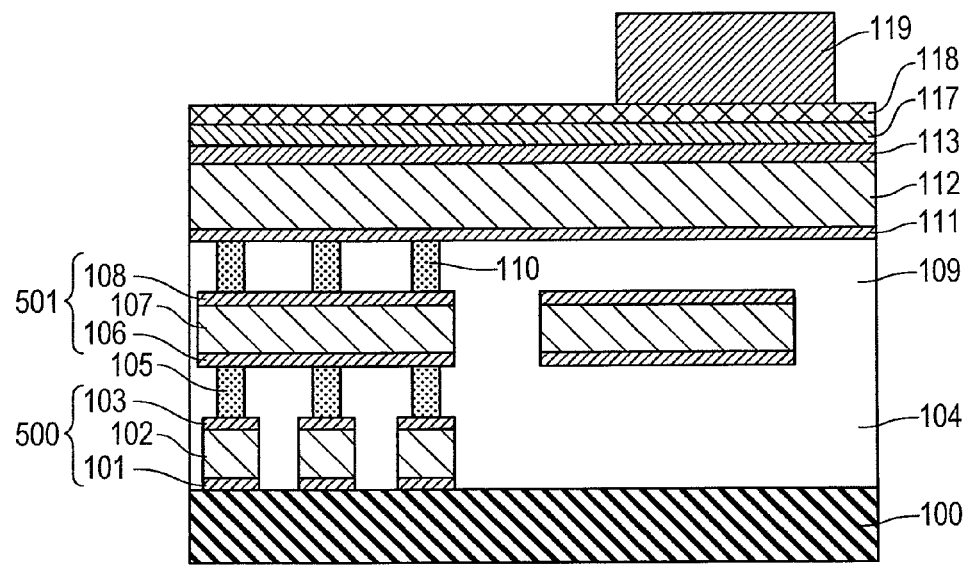
FIG. 17 is a diagram for explaining the process flow of the MIM capacitor of the embodiment 2.
Figure 18:
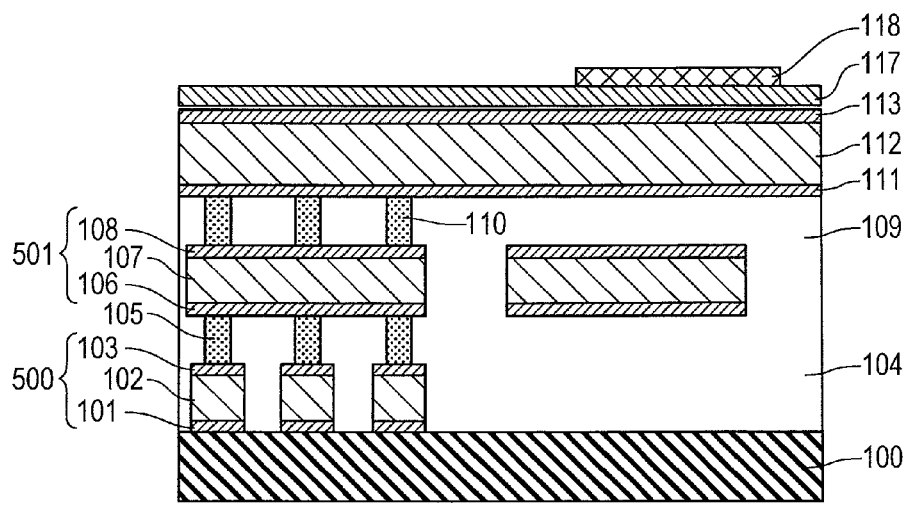
FIG. 18 is a diagram for explaining the process flow of the MIM capacitor of the embodiment 2.
Figure 19:
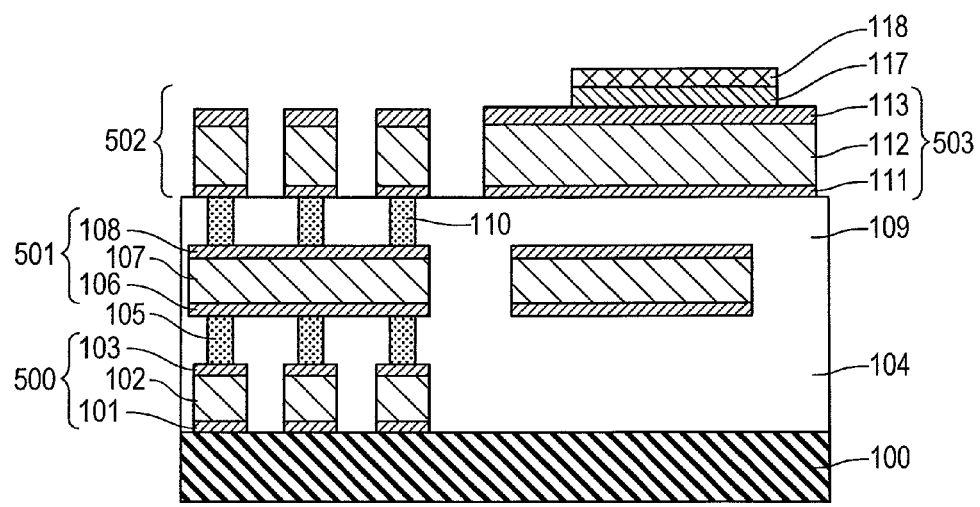
FIG. 19 is a diagram for explaining the process flow of the MIM capacitor of the embodiment 2.
Figure 20:
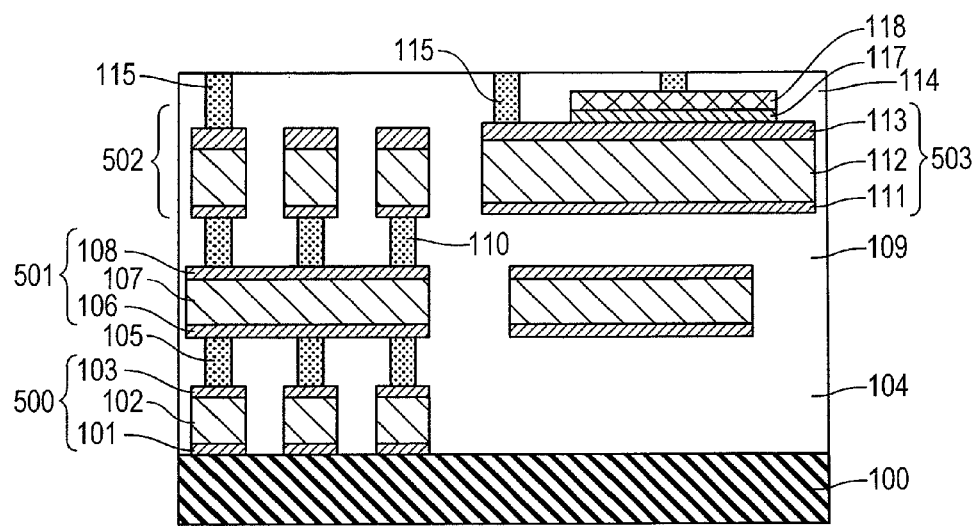
FIG. 20 is a diagram for explaining the process flow of the MIM capacitor of the embodiment 2.

A laminated film is formed of the lower barrier film 111, the aluminum alloy film 112 with a thickness of 400 nm, and the upper barrier film, using the sputtering technique. The film 111 includes a titanium film with a thickness of 10 nm and a titanium nitride film with a thickness of 30 nm, which are formed sequentially from the lower side. The film 113 includes a titanium film with a thickness of 10 nm and a titanium nitride film with a thickness of 20 nm, which are formed sequentially from the lower side, on the upper layer of the film 112. The capacitive insulating film 117 is formed on the film 113, and the protective film 118 (80 nm titanium nitride film) for the capacitive insulating film is formed using the sputtering technique. This protective film 118 for the capacitive insulating film is a part of the upper electrode of the MIM capacitor. The thickness of the capacitive insulating film 117 is set in accordance with the capacitance of the MIM capacitor, and the manufacturing method of the capacitive insulating film 117 is as described with reference to FIG. 24 and FIG. 25. FIG. 17 shows a state in which the resist mask 119 is formed in the MIM capacitor part using the lithography technique, after forming the above films. After the capacitive insulating film 117 and the protective film 118 for the capacitive insulating film 117 are etched using the dry etching technique, the resist mask 119 is removed therefrom (FIG. 18). After this, the third metal wiring layer 502 is processed using the lithography technique and the dry etching technique (FIG. 19). After a 1300 nm silicon oxide film is formed using the plasma CVD technique, the surface is made flat using the CMP technique to form the third interlayer insulating film 114. Now, a contact hole is formed in a manner that the third metal wiring layer 502 and the MIM capacitor lower electrode 503 are exposed, using the lithography technique and the dry etching technique, and the conductive plug 115 including a barrier film and tungsten is formed in the contact hole (FIG. 20).

Figure 21:
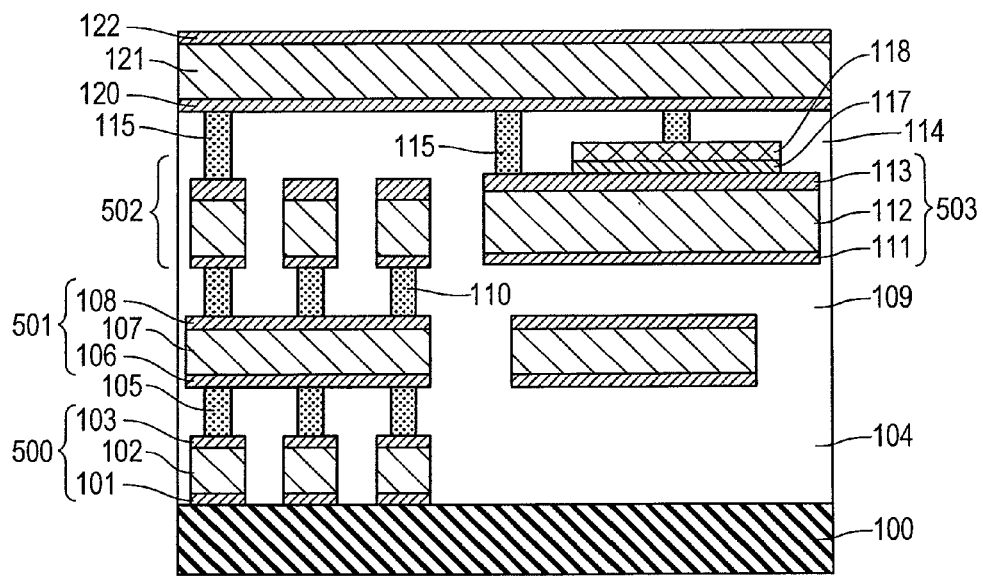
FIG. 21 is a diagram for explaining the process flow of the MIM capacitor of the embodiment 2.
Figure 22:
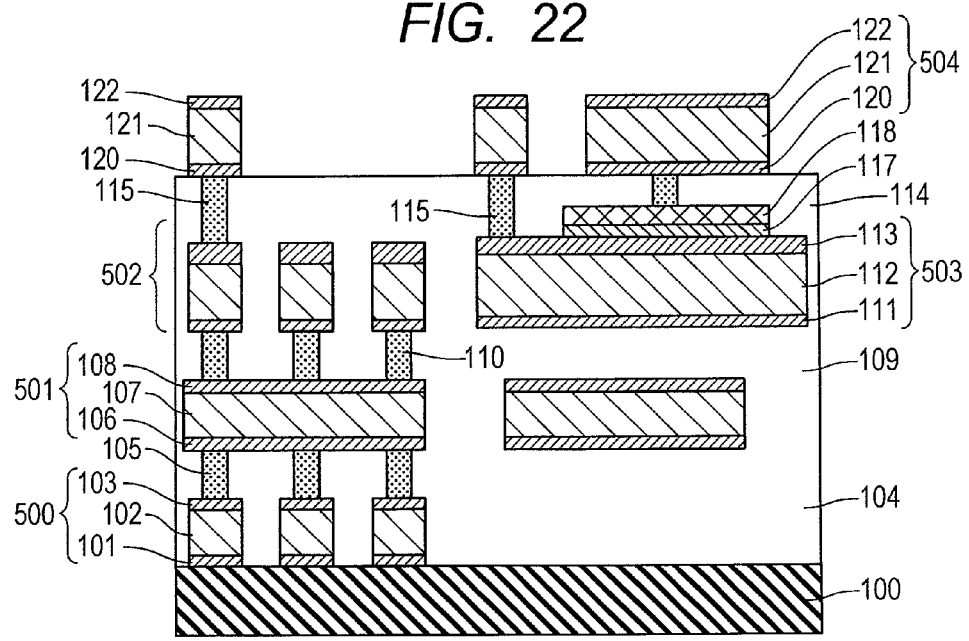
FIG. 22 is a diagram showing the MIM capacitor of the embodiment 2.

A laminated film is formed of the lower barrier film 120, the 400 nm aluminum alloy film 121, and the upper barrier film 122, using the sputtering technique (FIG. 21). The film 120 includes a titanium film with a thickness of 10 nm and a titanium nitride film with a thickness of 30 nm which are formed sequentially from the lower side. The upper barrier film 122 includes a titanium film with a thickness of 10 nm and a titanium nitride film with a thickness of 20 nm which are formed sequentially from the lower side, on the top of the film 121. The upper electrode 504 of the MIM capacitor is formed using the lithography technique and the dry etching technique for the laminated film (FIG. 22).

Figure 23:
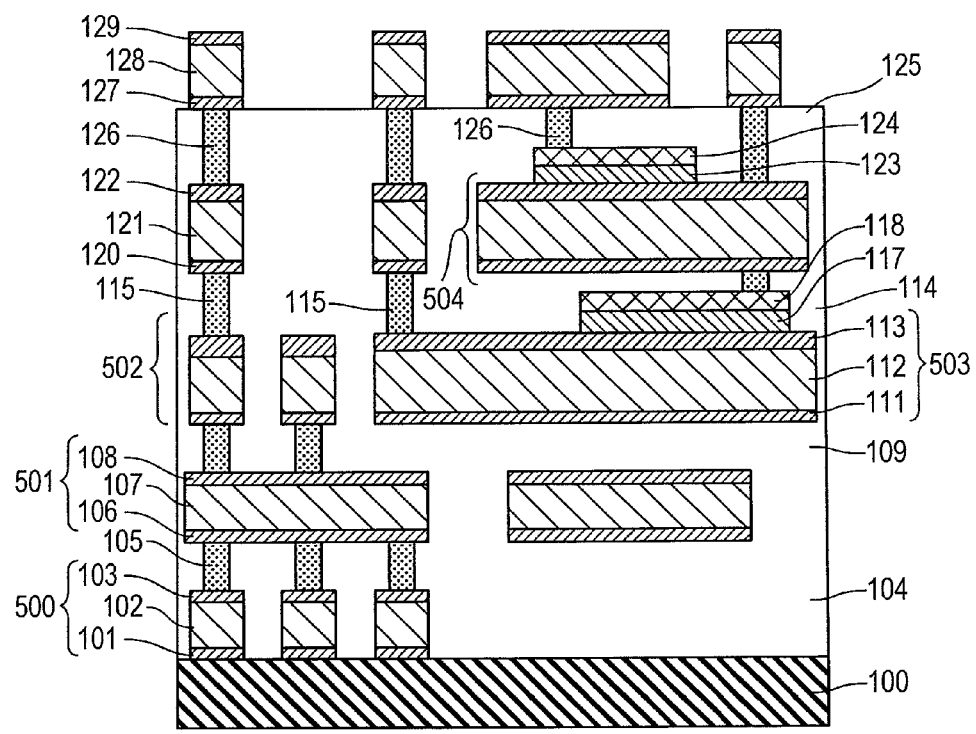
FIG. 23 is a diagram showing the MIM capacitor of the embodiment 2.

As illustrated in FIG. 23, a plurality of MIM structures may be formed in the same chip. In FIG. 23, a capacitive insulating film 123, an insulating film protective film 124, a fourth interlayer insulating film 125, a conductive connecting plug 126, a lower barrier film 127, an aluminum alloy film 128, and an upper barrier film 129 are formed on the MIM upper electrode 504.

What is claimed is:

1. A semiconductor device having a MIM (Metal-Insulator-Metal) capacitor, the MIM capacitor comprising:
    a lower electrode;
    an upper electrode, and
    a capacitive insulating film which is arranged between the lower electrode and the upper electrode,
    wherein the capacitive insulating film is a silicon oxynitride film whose composition ratios of N/Si and O/Si measured using an XPS (X-ray Photoemission Spectroscopy) technique satisfy $0.024 \leq N/Si \leq 0.22$ and $1.74 \leq O/Si \leq 2.1$.

2. The semiconductor device according to claim 1, wherein a first wiring layer is formed in a same layer as the lower electrode of the MIM capacitor.

3. The semiconductor device according to claim 2,
    wherein the upper electrode of the MIM capacitor has a protective film and a laminated metallic film,
    wherein a second wiring layer is formed in a same layer as the laminated metallic film, and
    wherein the second wiring layer is positioned over an upper layer of the first wiring layer.

4. The semiconductor device according to claim 3, wherein a trench reaching the lower electrode is formed in an interlayer insulating film which is formed between the first wiring layer and the second wiring layer, and
    wherein the capacitive insulating film is formed along a bottom and side surface of the trench.

5. The semiconductor device according to claim 3, wherein the protective film and the laminated metallic film are electrically connected with each other through a conductive plug.

* * * * *